United States Patent
Kudoh

[11] Patent Number: 5,898,006
[45] Date of Patent: Apr. 27, 1999

[54] METHOD OF MANUFACTURING A SEMICONDUCTOR DEVICE HAVING VARIOUS TYPES OF MOSFETS

[75] Inventor: Takaharu Kudoh, Tokyo, Japan

[73] Assignee: NEC Corporation, Japan

[21] Appl. No.: 08/524,850

[22] Filed: Sep. 7, 1995

[30] Foreign Application Priority Data

Sep. 14, 1994 [JP] Japan .................................. 6-244921

[51] Int. Cl.⁶ ...................... H01L 21/336; H01L 21/8234
[52] U.S. Cl. ............................................ 438/275; 438/258
[58] Field of Search .................................. 437/44, 56, 57, 437/58, 59, 34, 913; 438/275, 276, 278, 287, 258

[56] References Cited

U.S. PATENT DOCUMENTS

| | | | |
|---|---|---|---|
| 4,745,083 | 5/1988 | Huie | 437/57 |
| 4,775,642 | 10/1988 | Chang et al. | 437/57 |
| 4,851,361 | 7/1989 | Schumann et al. | 437/58 |
| 5,098,855 | 3/1992 | Komori et al. | 437/44 |
| 5,183,773 | 2/1993 | Miyata | 437/44 |

FOREIGN PATENT DOCUMENTS

62-169470  7/1987  Japan .

*Primary Examiner*—Michael Trinh
*Attorney, Agent, or Firm*—Hayes, Soloway, Hennessey, Grossman & Hage, P.C.

[57] ABSTRACT

In a method of manufacturing a semiconductor device including a first MOSFET for a non-volatile memory element, a second MOSFET for an input protecting element and a third MOSFET for a logic circuit element, gate structures of the first to third MOSFETs are formed on a p-type substrate. Then, an n-type impurity is injected in the substrate in self-alignment with the gate structure for the third MOSFET with a first dose amount to form source and drain regions for the third MOSFET. An n-type impurity is simultaneously injected in the substrate in self-alignment with the gate structures for the first and second MOSFETs to form source and drain regions for the first and second MOSFETs. A side wall insulating film is formed on a side wall of each of the gate structures of the thirst to third MOSFETs. An n-type impurity is injected in parts of the source and drain regions of the third MOSFET in self-alignment with the side wall and gate structure with a second dose amount which is higher than the first dose amount.

3 Claims, 4 Drawing Sheets

5,898,006

1

METHOD OF MANUFACTURING A SEMICONDUCTOR DEVICE HAVING VARIOUS TYPES OF MOSFETS

BACKGROUND OF THE INVENTION

1. Field of the Invention

The present invention relates to a method of manufacturing a semiconductor device having a non-volatile semiconductor memory built therein, and more particularly, to a method of manufacturing a semiconductor device composed of transistors of a single drain structure and transistors of a double drain structure such as a lightly doped drain structure or a graded junction structure.

2. Description of Related Art

Conventionally, in a semiconductor device such as a single chip microcomputer, circuits for a random access memory (RAM) and a read only memory (ROM) are mounted on the same chip in addition to logic circuits. In this case, at least a part of the ROM is formed of a non-volatile memory such as an electrically programmable ROM (EPROM). In the semiconductor device with such a non-volatile memory built therein, at least three types of metal-oxide-semiconductor field effect transistors (MOSFETs), i.e., MOSFETs for a logic circuit, MOSFETs for memory cells (including a MOSFET with a double gate electrode structure), and MOSFETs for input protection are required. Of these MOSFETs, the MOSFETs for the logic circuit preferably include source and drain regions formed so as to have double drain structure such as LDD structure or graded junction structure adapted to withstand hot electrons because the MOSFETs need to have resistance against hot electrons. The MOSFETs for the memory cell have source and drain regions formed so as to have single drain structure because hot electrons need to be effectively generated for writing data in the non-volatile memory cell. Further, in the MOSFETs for input protection, source and drain regions are formed so as to have single drain structure of low resistivity because the MOSFET can be prevented from being destroyed thermally by input electrostatic charge.

Next, a method of manufacturing the above-mentioned conventional semiconductor device will be described below with reference to FIGS. 1A to 1E.

First, as shown in FIG. 1A, a p-type silicon substrate 111 is provided with a memory cell formed region 102a, a MOSFET formed region 102b for input protection, and a MOSFET formed region 102c for a logic circuit on the surface region. In the memory cell formed region 102a, a double gate electrode structure 113a composed of a floating gate electrode 115a, an insulating film 114, and a control gate electrode 115b, is formed on the substrate 111 via a gate insulating film 112. In the MOSFET formed regions 102b and 102c, gate electrodes 113b and 113c of single gate structure are formed on the substrate 111 via the gate insulating films 112. Note that insulating films and regions for isolating elements are not shown because they are well known to a person skilled in the art. Thereafter, phosphorus (P) ions are injected into the substrate 111 with acceleration energy of 100 KeV and a dose amount of 2 to $3\times10^{13}$ $cm^{-2}$ in self-alignment with the double gate structure 113a and gate electrodes 113b and 113c using them as a mask to form n-type low dose amount diffusion layers 116.

Next, as shown in FIG. 1B, a photoresist layer 119 is formed on the whole surface of the substrate 111 and then the photoresist layer 119 is removed from the memory cell formed region 102a using a first photoresist mask. As a result, the MOSFET formed regions 102b and 102c remain

2 covered by the photoresist layer 119. Subsequently, arsenic (As) ions are injected into the substrate 111 with acceleration energy of 70 KeV and a dose amount of $5.0\times10^{15}$ $cm^{-2}$ in self-alignment with the double gate structure 113a using it as a mask. As a result, n-type high dose amount diffusion layers 118 are formed. The n-type diffusion layers 118 functions as source and drain regions of a MOSFET for a memory cell having single drain structure.

Next, as shown in FIG. 1C, the photoresist layer 119 is removed and a silicon oxide film is deposited on the whole substrate 111 by a low pressure CVD method. The silicon oxide film is etched back by an anisotropic plasma etching method, so that side wall insulating films 120a, 120b and 120c are formed on the side walls of the double gate structure 113a and gate electrodes 113b and 113c.

Next, as shown in FIG. 1D, a photoresist layer 121 is formed on the whole surface of the substrate 111. Then, the photoresist layer 121 is removed from the MOSFET formed region 102c for the logic circuit using a second photoresist mask, so that the memory cell formed region 102a and MOSFET formed region 102b for input protection remain covered with the photoresist layer 121. Subsequently, arsenic (As) ions are injected into the substrate 111 with acceleration energy of 70 KeV and dose amount of $3.0\times10^{15}$ $cm^{-2}$ in self-alignment with the gate electrode 113c and side wall insulating film 120c using them as a mask. As a result, n-type high dose amount diffusion layers 122 are formed while the low concentration n-type diffusion layers 116 remain. As a result, the source and drain regions having double drain structure, such as the graded junction structure or LDD structure are completed for the MOSFET for the logic circuit.

Finally, as shown in FIG. 1E, a photoresist layer 123 is formed on the whole surface of the substrate 111. Then, the photoresist layer 123 is removed from the MOSFET formed region 102b for input protection using a third photoresist mask, so that the memory cell formed region 102a and MOSFET formed region 102c for the logic circuit remain covered with the photoresist layer 123. Subsequently, phosphorus (P) ions are injected into the substrate 111 with acceleration energy of 70 KeV and dose amount of $1.0\times10^{15}$ $cm^{-2}$ in self-alignment with the gate electrode 113b and side wall insulating film 120b using them as a mask. As a result, n-type diffusion layers 124 of high dose amount are formed while the low concentration n-type diffusion layers 116 remain. A thermal treatment is performed after the ion injection. In this case, since the phosphorus ion has a greater diffusion coefficient than that of the arsenic ion, phosphorus ions diffuse from the n-type high dose amount diffusion layer to a portion under the side wall insulating film 120b so that the source and drain regions 124 having single drain structure are completed.

As described above, in the conventional method of manufacturing a semiconductor device with a non-volatile memory built therein, the MOSFET having a single drain structure for the memory cell and input protection and the MOSFET having the double drain structure for the logic circuit are formed through a process of injecting impurity into all the MOSFET in common with a low dose amount, and a process of individually injecting impurity into each of the MOSFETs with a high dose amount. Therefore, three photoresist masking processes and four ion injecting processes are required. As a result, it is difficult to reduce manufacturing cost of the semiconductor device, and production yield also is reduced.

SUMMARY OF THE INVENTION

The present invention is made from the above standpoint and has, as an object, to provide a method of manufacutring a semiconductor device having various types of MOSFETs with simple processes.

Another object of the present invention is to provide a method of manufacturing a semiconductor device wherein the method can be simplified based on the drain structure.

In order to achieve an aspect of the present invention, a method of manufacturing a semiconductor device is provided including on a single chip a non-volatile memory element, an input protecting element and a logic circuit element, comprising the steps of:

(a) forming gate structures of the non-volatile memory element, input protecting element and logic circuit element on a substrate of a first conductivity type;

(b) injecting an impurity of a second conductivity type in the substrate in self-alignment with the gate structure for the logic circuit element with a first dose amount to form source and drain regions for the logic circuit element;

(c) simultaneously injecting an impurity of the second conductivity type in the substrate in self-alignment with the gate structures for the non-volatile memory element and input protecting element to form source and drain regions for the non-volatile memory element and input protecting element; and (d) injecting an impurity of the second conductivity type in parts of the source and drain regions of the logic circuit element apart from the gate structure with a second dose amount which is higher than the first dose amount.

The non-volatile memory element, input protecting element and logic circuit element may be a first type of MOSFET required to have capability of generation of hot electrons, a second type of MOSFET required to have resistance against electrostatic break down, and a third type of MOSFET required to have resistance against hot electrons, respectively.

In the above, a side wall insulating film is preferably formed on a side wall of each of the gate structures of the non-volatile memory element, input protecting element and logic circuit element before the injection for the logic circuit element is performed. If there is the side wall insulating film, the impurity of the second conductivity type is injected in the parts of the source and drain regions of the logic circuit element in alignment with the side wall insulating film and gate structure for the logic circuit element. In this case, the injection may be performed so as to form the source and drain regions so as to have a lightly doped drain (LDD) structure or a graded junction structure.

In order to form the source and drain regions of the non-volatile memory element and input protecting element, it is preferable that the impurity of the second conductive type is simultaneously injected in the substrate in self-alignment with the gate structures for the non-volatile memory element, input protecting element and logic circuit element with the first dose amount. The injection of phosphorus (P) ions is performed in step (b), and the injection of arsenic ions (As) is performed in steps (c) and (d), masking a region for the logic circuit element to be formed, by photoresist using a first mask in step (c) and masking regions for the non-volatile memory element and input protecting element to be formed, by photoresist using a second mask in step (d).

In order to achieve another aspect of the present invention, a method of manufacturing a semiconductor device including on a single chip a first type of metal-oxide-semiconductor field effect transistor (MOSFET) required to have capability of generation of hot electrons, a second type of MOSFET required to have resistance against electrostatic break down, and a third type of MOSFET required to have resistance against hot electrons, comprising the steps of:

(a) forming gate structures of the first to third types of MOSFETs on a substrate of a first conductivity type;

(b) forming the first and second types of MOSFETs using a first mask for masking the third type of MOSFET; and (c) forming the third type of MOSFET using a second mask for masking the first and second types of MOSFETs.

DESCRIPTION OF THE PREFERRED EMBODIMENTS

The method of manufacturing a semiconductor device with a non-volatile memory built therein, according to the present invention, will be described below with reference to the accompanying drawings.

Figure 1A:
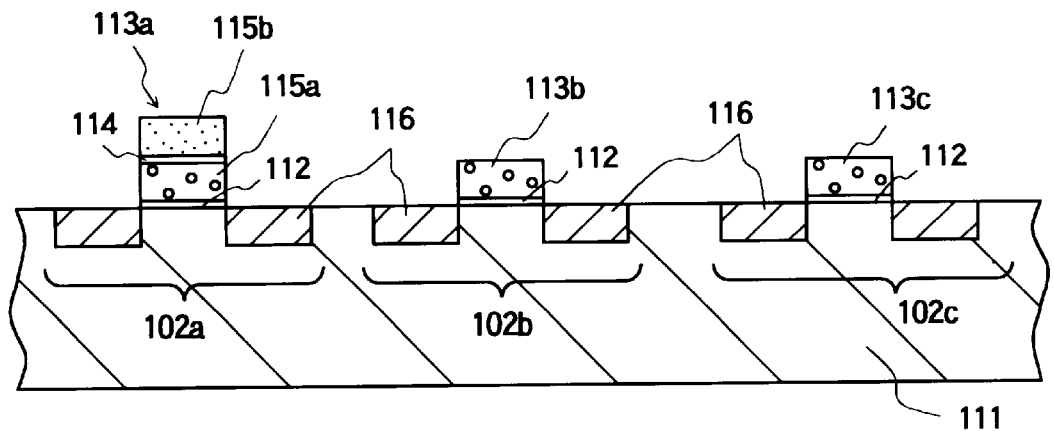
FIGS. 1A to 1E are schematic diagrams showing a conventional method of manufacturing a semiconductor device with a non-volatile memory built therein.
Figure 1B:
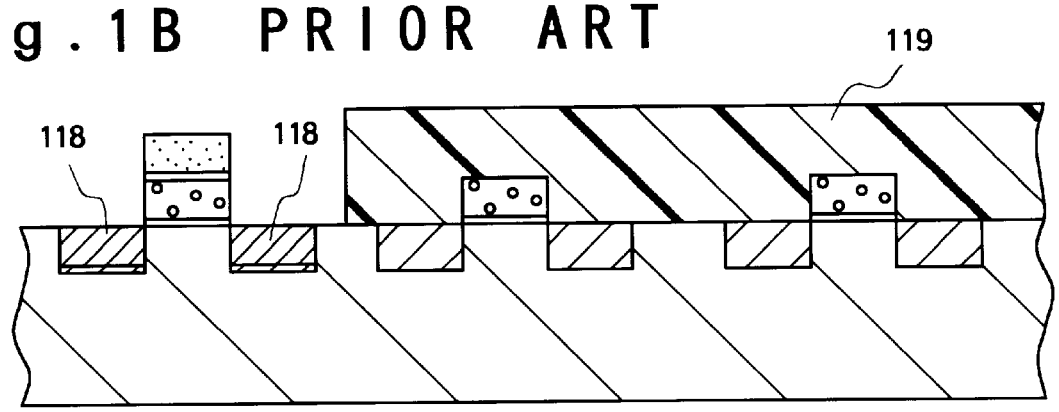
Figure 1C:
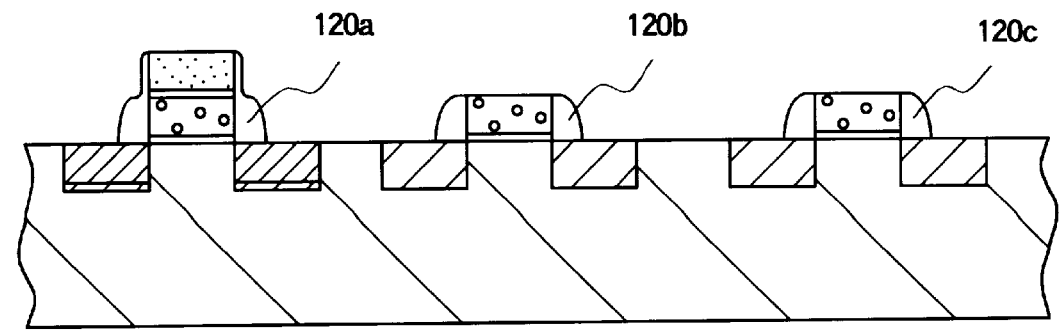
Figure 1D:
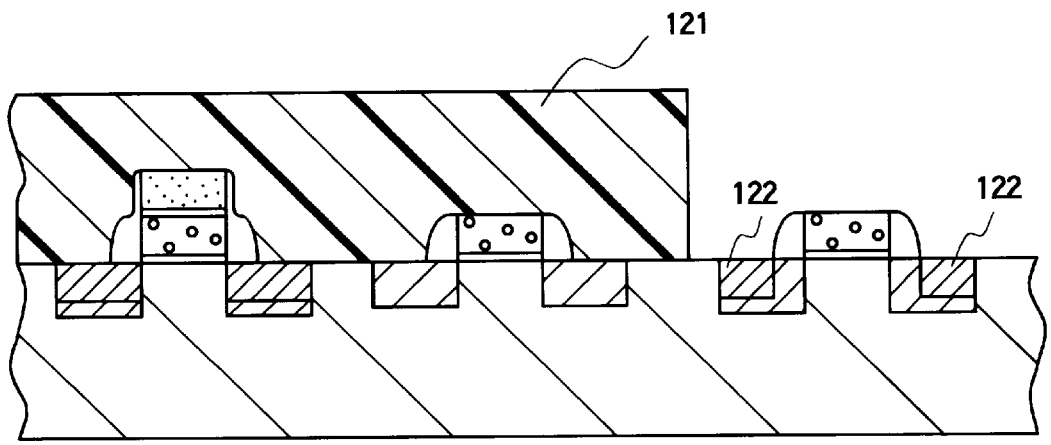
Figure 1E:
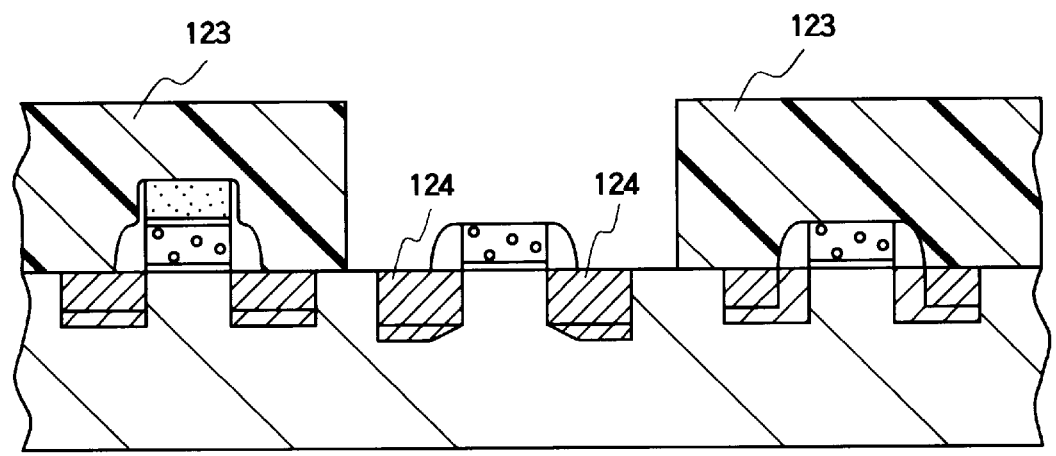
Figure 2A:
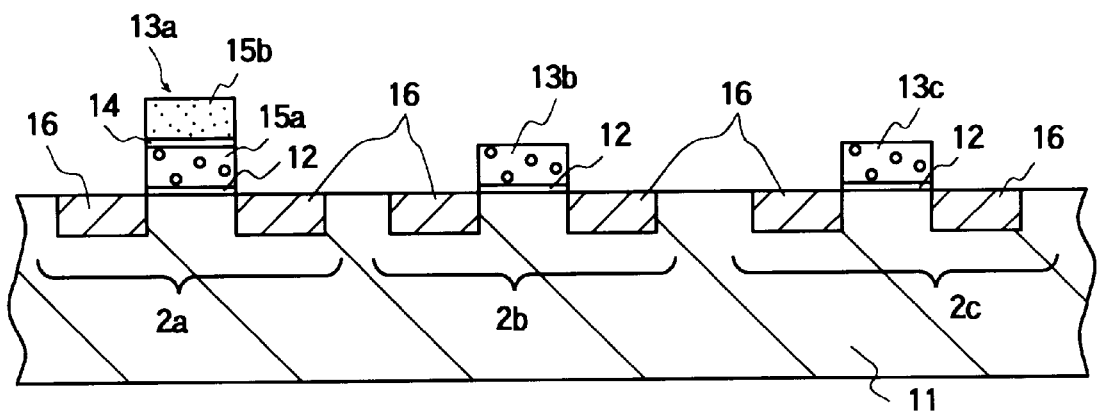
FIGS. 2A to 2D are schematic diagrams showing a method of manufacturing a semiconductor device with a built-in non-volatile memory according to the present invention.

First, referring to FIG. 2A, a p-type silicon substrate 11 is provided with a MOSFET formed region 2a for a memory cell such as an EPROM, a MOSFET formed region 2b for input protection, and a MOSFET formed region 2c for a logic circuit on the surface region. In the MOSFET formed region 2a for the memory cell, a double gate electrode structure 13a composed of a gate electrode 15a, an insulating film 14, and a control gate electrode 15b, is formed on the substrate 11 via a gate insulating film 12. In the MOSFET formed regions 2b and 2c, gate electrodes 13b and 13c of a single gate structure are formed on the substrate 11 via the gate insulating films 12. Note that films and regions for isolating elements are not shown because they are well known to a person skilled in the art. Thereafter, phosphorus (P) ions are injected into the substrate 11 with acceleration energy of 100 KeV and dose amount of 2 to $3 \times 10^{13}$ cm$^{-2}$ in self-alignment with the double gate structure 13a and single gate electrodes 13b and 13c using them as a mask to form n-type diffusion layers 116 of low dose amount.

Figure 2B:
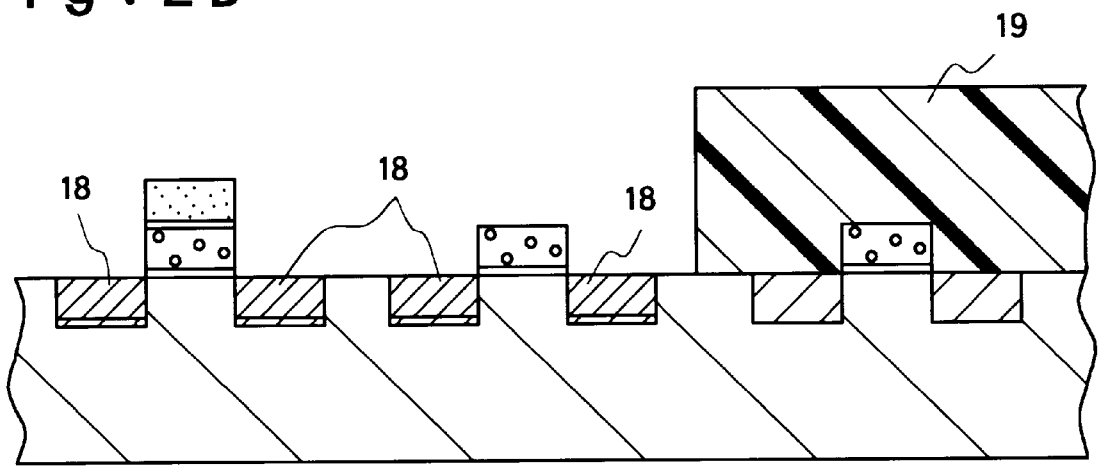

Next, as shown in FIG. 2B, a photoresist layer 19 is formed on the whole surface of the substrate 11 and then the photoresist layer 19 is removed from the MOSFET formed regions 2a and 2b for the memory cell and input protection using a first photoresist mask. As a result, the MOSFET formed region 2c remains covered by the photoresist layer 19. Subsequently, arsenic (As) ions are injected into the substrate 11 with acceleration energy of 70 KeV and dose amount of $5.0 \times 10^{15}$ cm$^{-2}$ in self-alignment with the double gate structure 13a and single gate structure 13b using them as a mask. As a result, n-type diffusion layers 18 of high dose amount are formed while low dose amount n-type diffusion layers 16 remain under the layers 18. The n-type diffusion layers 18 function as source and drain regions of the MOSFETs having single drain structure. In the source and drain regions of the MOSFET formed region 2a, it is desirable that the impurity doping level is high because hot electrons can be effectively generated. Also, in the source and drain regions of the MOSFET formed region 2b, it is desirable that the impurity doping level is high because electrostatic charge can be effectively discharged. Thus, the actual impurity doping level is selected from the region where the region of impurity doping level desired for the MOSFET for a non-volatile memory cell and the region of impurity doping level desired for the MOSFET for input protection overlap.

Figure 2C:
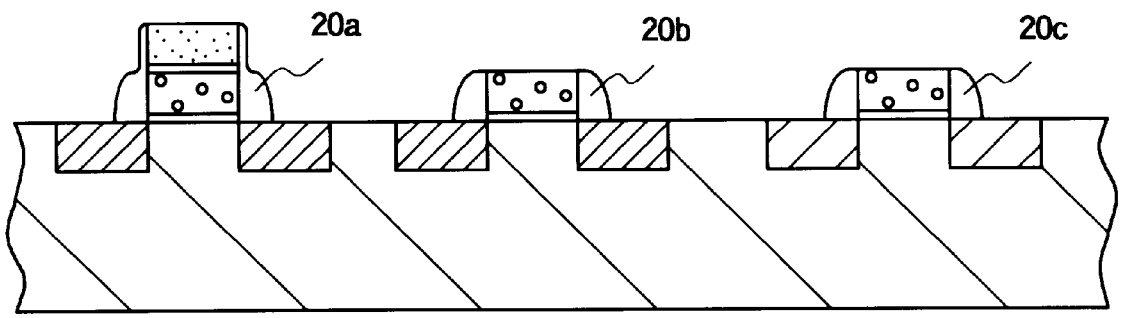

Next, as shown in FIG. 2C, the photoresist layer 19 is removed and a silicon oxide film is deposited on the whole substrate 111 by a low pressure CVD method. The silicon oxide film is etched back by an anisotropic plasma etching method, so that side wall insulating films 20a, 20b and 20c are formed on the side walls of the double gate structure 13a and single gate electrodes 13b and 13c.

Figure 2D:
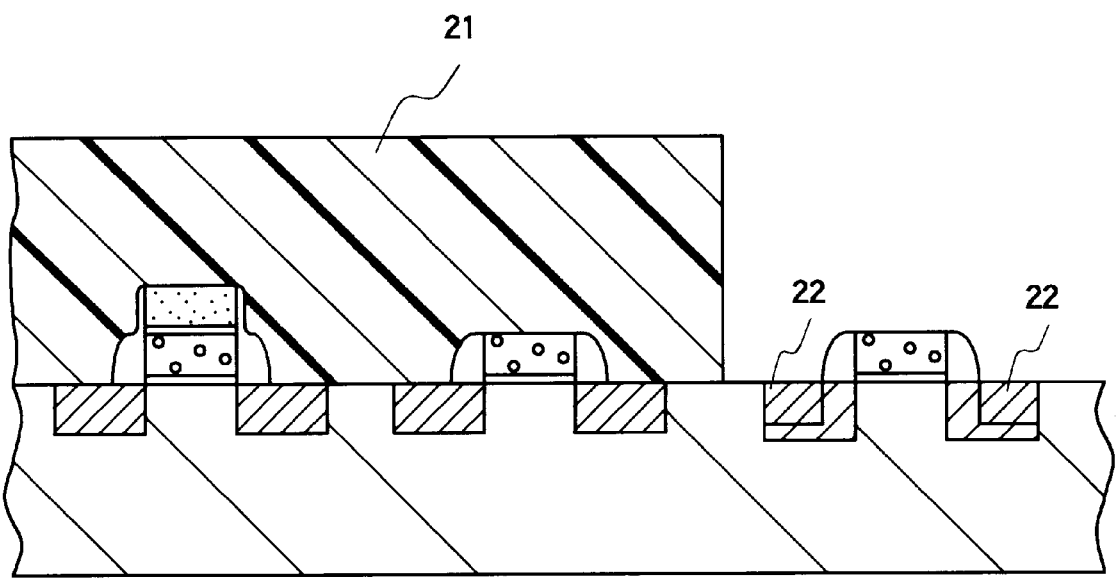

Next, as shown in FIG. 2D, a photoresist layer 21 is formed on the whole surface of the substrate 11. Then, the photoresist layer 21 is removed from the MOSFET formed region 2c for the logic circuit using a second photoresist mask, so that the MOSFET formed regions 2a and 2b remain covered with the photoresist layer 21. Subsequently, arsenic (As) ions are injected into the substrate 11 with acceleration energy of 70 KeV and dose amount of 3.0 to $5.0 \times 10^{15}$ cm$^{-2}$ in self-alignment with the gate electrode 13c and side wall insulating film 20c using them as a mask. As a result, n-type diffusion layers 22 of high dose amount are formed at part of the n-type low dose amount diffusion layers 16. As a result, the source and drain regions having the double drain structure, such as the LDD or graded junction structure, can be completed for the MOSFET for the logic circuit. Therefore, generation of hot electrons can be suppressed.

As described above, according to the present invention, three types of MOSFETs having the single drain and double drain structure, such as the LDD or graded junction structure, can be formed by two photoresist mask forming processes and three ion injecting processes. Therefore, one photoresist mask forming and one ion injecting process can be omitted compared to the conventional method of the semiconductor device. Although the whole processes are simplified, the capability to generate effectively hot electrons, resistance against electrostatic break down, and suppression of generation of hot electrons can be satisfied in the MOSFET for a memory cell such as an EPROM, the MOSFET for input protection, and the MOSFET for logic circuit, respectively.

What is claimed is:

1. A method of manufacturing a semiconductor device including on a single chip a non-volatile memory element, an input protecting element and a logic circuit element, comprising the steps of:

(a) forming a first gate of a first MOS transistor for said non-volatile memory element, a second gate of a second MOS transistor for said input protecting element and a third gate of a third MOS transistor for said logic circuit element on a substrate of a first conductivity type;

(b) simultaneously injecting a first impurity of a second conductivity type in said substrate in self-alignment with said first gate of said first MOS transistor for said non-volatile memory element, said second gate of said second MOS transistor for said input protecting element and said third gate of said third MOS transistor for said logic circuit element with a first dose amount;

(c) after said step (b) for a first mask for masking said third MOS transistor for said logic circuit element;

(d) after said step (c), injecting a second impurity of the second conductivity type in said substrate in self-alignment with said first and second gates of said first MOS transistor for said non-volatile memory and said second MOS transistor for said input protecting element with a second dose amount which is higher than said first dose amount so as to form source and drain regions of said first and second MOS transistors for said non-volatile memory element and input protecting element having single drain structure;

(e) removing said first mask, and forming first side wall insulating films on sidewalls of said third gate of said third MOS transistor for said logic circuit element;

(f) after said step (e) forming a second mask for masking said first and second MOS transistors for said non-volatile memory element and input protecting element; and (g) injecting a third impurity of the second conductivity type in said source and drain regions of said third MOS transistor for said logic circuit in self-alignment with said third gate and said side wall insulating films with a bird dose amount which is higher than said first dose amount so as to form an LDD structure.

2. The method of manufacturing a semiconductor device according to claim 1, wherein said step (e) includes:

forming other side wall insulating film on side walls of said first and second gates of said first and second MOS transistors for said non-volatile memory element and input protecting element at the same time that said first side wall insulating films are formed on said third MOS transistor for said logic circuit element.

3. The method of manufacturing a semiconductor device according to claim 1, wherein the impurity injected in said step (b) is phosphors (P) and the impurity injected in said step (d) is arsenic (As).

* * * * *

UNITED STATES PATENT AND TRADEMARK OFFICE
CERTIFICATE OF CORRECTION

PATENT NO. : 5,898,006
DATED : April 27, 1999
INVENTOR(S) : KUDOH

It is certified that error appears in the above-identified patent and that said Letters Patent is hereby corrected as shown below:

Claim 1, Column 6, line 35, "bird" should be --third--.

Signed and Sealed this

Twenty-eighth Day of September, 1999

Attest:

Q. TODD DICKINSON

Attesting Officer     Acting Commissioner of Patents and Trademarks